(12) United States Patent
Yamada et al.

(10) Patent No.: US 9,401,493 B2
(45) Date of Patent: Jul. 26, 2016

(54) ORGANIC ELECTROLUMINESCENT ELEMENT, METHOD FOR MANUFACTURING SAME, AND ORGANIC ELECTROLUMINESCENT DISPLAY DEVICE

(75) Inventors: Makoto Yamada, Osaka (JP); Yoshimasa Fujita, Osaka (JP); Hidenori Ogata, Osaka (JP); Yuhki Kobayashi, Osaka (JP); Ken Okamoto, Osaka (JP)

(73) Assignee: Unified Innovative Technology, LLC, Wilmington, DE (US)

( * ) Notice: Subject to any disclaimer, the term of this patent is extended or adjusted under 35 U.S.C. 154(b) by 0 days.

(21) Appl. No.: 13/516,689

(22) PCT Filed: Dec. 6, 2010

(86) PCT No.: PCT/JP2010/071833
§ 371 (c)(1),
(2), (4) Date: Jun. 15, 2012

(87) PCT Pub. No.: WO2011/092939
PCT Pub. Date: Aug. 4, 2011

(65) Prior Publication Data
US 2012/0267619 A1   Oct. 25, 2012

(30) Foreign Application Priority Data
Jan. 26, 2010  (JP) ................. 2010-014389

(51) Int. Cl.
*H01L 51/56*   (2006.01)
*H01L 51/50*   (2006.01)

(52) U.S. Cl.
CPC ........ *H01L 51/5096* (2013.01); *H01L 51/5004* (2013.01); *H01L 51/506* (2013.01);
(Continued)

(58) Field of Classification Search
CPC ............. H01L 2251/552; H01L 51/5048; H01L 51/5052; H01L 51/5056; H01L 51/506; H01L 51/5064; H01L 51/5068; H01L 51/5072; H01L 5/5076; H01L 5/508; H01L 5/5084; H01L 5/5088; H01L 5/5092; H01L 5/5096

USPC ............ 257/40, 98, 584, E51.018, E51.008, 257/E51.022; 327/584; 438/29
See application file for complete search history.

(56) References Cited

U.S. PATENT DOCUMENTS

2002/0018912 A1   2/2002  Jung et al.
2003/0189401 A1   10/2003 Kido et al.
(Continued)

FOREIGN PATENT DOCUMENTS

JP   09-127885 A   5/1997
JP   2002-69013 A  3/2002
(Continued)

OTHER PUBLICATIONS

Diouf et al., "Efficiency Control in Iridium Complex-Based Phosphorescent Light-Emitting Diodes", May 2, 2012, Advances in MAterials Science and Engineering, vol. 2012, p. 7/14.*
(Continued)

*Primary Examiner* — Kenneth Parker
*Assistant Examiner* — Bo Fan
(74) *Attorney, Agent, or Firm* — Birch, Stewart, Kolasch & Birch, LLP

(57) ABSTRACT

An organic EL element (1) according to the present invention is such that a positive and negative charge transport layer (30) is interposed between a cathode (20) and an anode (10). The positive and negative charge transport layer (30) is composed of a single host material and has a light-emitting region (33) which is doped with a light-emitting dopant. The positive and negative charge transport layer (30) further has at least one of the following blocking regions: an electron blocking region (32), provided closer to the anode (10) than the light-emitting region (33), having a lowest unoccupied molecular orbital lower than that of the lowest unoccupied molecular orbital of the light-emitting region (33); and a hole blocking region (34), provided closer to the cathode (20) than the light-emitting region (33), having a highest occupied molecular orbital higher than that of the highest occupied molecular orbital of the light-emitting region (33).

11 Claims, 3 Drawing Sheets

(52) U.S. Cl.
CPC ........ *H01L51/5012* (2013.01); *H01L 51/5048* (2013.01); *H01L 51/5076* (2013.01); *H01L 2251/5346* (2013.01)

(56) References Cited

U.S. PATENT DOCUMENTS

| | | | | |
|---|---|---|---|---|
| 2006/0250076 | A1* | 11/2006 | Hofmann | H01L 51/002 313/504 |
| 2008/0268285 | A1* | 10/2008 | Okinaka | H01L 51/0054 428/691 |
| 2009/0052195 | A1 | 2/2009 | Saneto et al. | |
| 2009/0104472 | A1* | 4/2009 | Je | C07F 15/0033 428/690 |
| 2009/0309487 | A1* | 12/2009 | Royster, Jr. | H01L 51/0082 313/504 |
| 2009/0309492 | A1* | 12/2009 | Hofmann | B82Y 20/00 313/504 |
| 2010/0044689 | A1* | 2/2010 | Nishimura | C09K 11/06 257/40 |
| 2010/0084672 | A1* | 4/2010 | Ueno et al. | 257/98 |

FOREIGN PATENT DOCUMENTS

| | | | |
|---|---|---|---|
| JP | 2002069013 A | * | 3/2002 |
| JP | 2003-109747 A | | 4/2003 |
| JP | 2003-272860 A | | 9/2003 |
| JP | 2004-349224 A | | 12/2004 |
| JP | 2004349224 A | * | 12/2004 |
| JP | 2005-85529 A | | 3/2005 |
| JP | 2005085529 A | * | 3/2005 |
| JP | 2009-110930 A | | 5/2009 |
| JP | 2009-164049 A | | 7/2009 |
| WO | 2008/120714 A1 | | 10/2008 |
| WO | 2008/123178 A1 | | 10/2008 |
| WO | 2011/125363 A1 | | 10/2011 |

OTHER PUBLICATIONS

International Search Report and Written Opinion received for PCT Patent Application No. PCT/JP2010/071833, mailed on Mar. 8, 2011, 23 pages (13 pages of English translation and 10 pages of Search Report and Written Opinion).

International Preliminary Report on Patentability received for PCT Patent Application No. PCT/JP2010/071833, issued on Aug. 9, 2012, 19 pages (12 pages of English translation and 7 pages of IPRP).

Tsuji et al., "Bis(Carbazolyl)Benzodifuran: A High-Mobility Ambipolar Material for Homojunction Organic Light-Emitting Diode Devices", Advanced Materials, vol. 21, 2009, pp. 3776-3779.

\* cited by examiner

ORGANIC ELECTROLUMINESCENT ELEMENT, METHOD FOR MANUFACTURING SAME, AND ORGANIC ELECTROLUMINESCENT DISPLAY DEVICE

CROSS REFERENCE TO RELATED APPLICATIONS

This is a U.S. National Phase patent application of PCT/JP2010/071833, filed Dec. 6, 2010, which claims priority to Japanese Patent Application No. 2010-014389, filed Jan. 26, 2010, each of which is hereby incorporated by reference in the present disclosure in its entirety.

TECHNICAL FIELD

The present invention relates to an organic electroluminescent element that realizes a high luminance, a high efficiency, and a long lifetime, a method for manufacturing the same, and an organic electroluminescent display device.

BACKGROUND ART

In the past, cathode-ray tube display devices were the mainstream of display devices, but in recent years the needs for thin flat-panel displays (FPDs) have been growing. There are various kinds of FPDs, among which known are non-self-luminous liquid crystal displays (LCD), self-luminous plasma display panels (PDP), inorganic electroluminescent (inorganic EL) displays, organic electroluminescent (organic EL) displays, for example.

In particular, organic EL displays have thin, lightweight display-use elements (organic EL element) and have properties such as low-voltage driving, high luminance, and self-luminance. Because of this, research and development of the organic EL displays have been actively carried out. Recently, there have been expected applications of the organic EL displays to light sources for an electrophotographic copier, a printer, an organic semiconductor laser, and other devices and to luminous objects such as a display, lighting, a liquid crystal backlight, and the like. The use of the organic EL elements, which provide surface emission, as luminous objects offers the advantages of showing high color rendering properties and facilitating light controls. Further, the organic EL elements have many advantages. For example, the organic EL elements are mercury-free, while fluorescent lamps contain mercury. Besides, the organic EL elements emit ultraviolet-free light.

Typical organic EL elements are heterojunction-type organic EL elements as shown in FIG. 5. FIG. 5 is a diagram showing a cross-section of a conventional heterojunction-type organic EL element 120*a*. The heterojunction-type organic EL element 120*a* shown in FIG. 5 has a multilayer structure wherein a hole injection layer 113, a hole transport layer 114, a light-emitting layer 115, a hole blocking layer 116, and an electron transport layer 117, an electron injection layer 118, and other layers are provided between an anode 112 and a cathode 119. The organic EL element employing such a multilayer structure enables increase in luminous efficiency and increase in lifetime of light emission.

In recent years, organic EL elements prepared with a phosphorescent material as a light-emitting layer have been spreading. The organic EL elements prepared with a phosphorescent material have the advantages of a high luminous efficiency and a long lifetime of light emission.

The organic EL element having the above-described structure enhances luminous efficiency and lifetime of light emission. However, a complex layer structure of the organic EL element results in the problem of a complicated manufacturing process, thus causing increase in cost of a manufacturing apparatus, increase in material costs, and other problems.

In order to solve the above problems, a homojunciton-type organic EL element composed of a single matrix which includes a light-emitting region between the electrodes has been studied. However, it is not easy to achieve an organic EL element with a high performance of a host material and a high efficiency in injection of holes and electrons from an anode and a cathode. As a result, there have been developed a homojunction-type organic EL element 220*b* doped with a material that enhances an efficiency in injection of holes and electrons, as shown in FIG. 6.

For the homojunction-type organic EL element 220*b* shown in FIG. 6, a matrix (host) of a single substance is doped with other substance from outside, thereby forming an acceptor region 200, and a light-emitting region 201, a donor region 202, and others, all of which constitutes a positive and negative charge transporting light-emitting layer. That is, the homojunction-type organic EL element has a plurality of regions in the single matrix (positive and negative charge transporting light-emitting layer). Such a structure, which is a simple layer structure, enables a simplified manufacturing process.

For example, Non-Patent Literature 1 discloses a homojunction-type organic EL element emitting light beams of three primary colors. The organic EL element disclosed in Non-Patent Literature 1 is such that an organic thin film of 50 nm to 100 nm in thickness and an aluminum (Al) metal (cathode) are sequentially formed on a transparent electrode (anode) of indium tin oxide (ITO) by vacuum deposition. The organic thin film contains bis(carbazolyl)benzodifuran (CzBDF) as a single matrix (host). An area of 30 nm from the anode in the matrix is subjected to p-type doping by co-deposition with an inorganic oxidizing agent (vanadium pentoxide). On the other hand, an area of 20 nm from the cathode is subjected to n-type doping by the co-deposition with a reducing agent (metal cesium). The above structure facilitates injection of charges from the electrodes to CzBDF and transport of charges.

In addition, in the organic EL element of the Non-Patent Literature 1, an intermediate layer (50 nm to 100 nm in thickness), which is not doped with an oxidizing agent and a reducing agent, is doped with a blue fluorescent pigment, a green fluorescent pigment, and a red phosphorescent pigment. This realizes primary-color light emission attributed to light emission of the pigments. In particular, a green fluorescent element exerts an external quantum efficiency of 4.2%, which is close to a theoretical efficiency limit (5%) of a fluorescent organic EL element, at a high luminance of 60,000 candelas/m$^2$.

The properties described above are considered to be attributed to the following CzBDF characteristics (1) through (3):

(1) being highly balanced, of high mobility, and capable of transporting positive and negative charges;

(2) being of an adequately large energy gap (on the order of 3 eV) between a highest occupied molecular orbital (HOMO) and a lowest unoccupied molecular orbital (LUMO), and being a wide gap material; and (3) being capable of effectively trapping electrical charges in luminescent pigments.

CITATION LIST

Non-Patent Literature

Non-Patent Literature 1

ADVANCED MATERIALS 2009, Vo. 21, No. 37, p. 3776-3779

SUMMARY OF INVENTION

Technical Problem

However, the aforementioned configuration shown in FIG. 6 has the following problems.

(1) The use of a single host with a hole mobility and an electron mobility of much the same degree results in a failure to trap charges of holes and electrons due to hole-electron recombination in a bulk, and a difference in degree of decrease between the hole mobility and the electron mobility due to aging causes unbalanced proportion of holes and electrons. This results in lifetime problems such as decrease in luminous efficiency and color aberration incident to shift of a recombination site.

(2) A high luminance is not achieved because the failure to trap electrical charges causes ineffective hole-electron recombination in conditions of a high luminance (when operated at a high current).

Solution to Problem

The present invention has been attained in view of the above problems, and an object of the present invention is to provide an organic electroluminescent element that realizes a high luminance, a high efficiency, and a long lifetime, a method for manufacturing the same, and an organic electroluminescent display device.

That is, in order to solve the above problems, an organic electroluminescent element according to the present invention is an organic electroluminescent element including:

a positive and negative charge transport layer having a hole transporting capability and an electron transporting capability;

an anode;

a cathode; and a substrate, the positive and negative charge transport layer being interposed between the anode and the cathode, the positive and negative charge transport layer, the anode, and the cathode being stacked on the substrate, the positive and negative charge transport layer, which is a homojunction-type layer, including:

a light-emitting region which is doped with a light-emitting dopant, the positive and negative charge transport layer further including at least one of:

an electron blocking region, provided closer to the anode than the light-emitting region, having a lowest unoccupied molecular orbital an absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the positive and negative charge transport layer being formed to be a thin layer by reaction of at least one of organic material components for the positive and negative charge transport layer on a surface of the substrate or in a vapor phase.

According to the above configuration, the organic electroluminescent element according to the present invention is such that the positive and negative charge transport layer has the light-emitting region and at least one of the electron blocking region that blocks movement of electrons and the hole blocking region that blocks movement of holes.

Therefore, holes propagated from the anode and electrons propagated from the cathode are trapped in the light-emitting region. This makes it possible to increase the probability of electron-hole recombination in the light-emitting region, thus decreasing a drive voltage for the organic EL element 1.

Moreover, the increase of the probability of electron-hole recombination in the light-emitting region enables an enhanced internal quantum efficiency and an enhanced luminous efficiency.

However, the positive and negative charge transport layer does not necessarily include both the electron blocking region and the hole blocking region. Even if the positive and negative charge transport layer includes either one of them, it is possible to sufficiently increase the probability of electron-hole recombination.

Therefore, it is possible to provide an organic electroluminescent element that realizes a high luminance, a high efficiency, and a long lifetime.

Note that the homojunction-type layer herein may be composed of a single host material or multiple host materials. Details will be described later.

Further, the present invention encompasses an organic electroluminescent display device including: display means having an organic electroluminescent element with the above-described configuration formed on a thin-film transistor substrate.

In order to solve the above problems, a method for manufacturing an organic electroluminescent element according to the present invention is a method for manufacturing an organic electroluminescent element including a homojunction-type positive and negative charge transport layer having a hole transporting capability and an electron transporting capability interposed between an anode and a cathode, the method comprising:

(a) a step of forming the positive and negative charge transport layer, comprising the sub-steps of:

(i) forming a light-emitting region by doping a host material with a light-emitting dopant; and (ii) forming at least one of the following blocking regions: an electron blocking region, provided closer to the anode than the light-emitting region, having a lowest unoccupied molecular orbital absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the step (a) forming the positive and negative charge transport layer to be a thin layer by reaction of at least one of organic material components for the positive and negative charge transport layer on a surface of the substrate or in a vapor phase.

According to the above method for manufacturing an organic electroluminescent element, it is possible to provide an organic electroluminescent element including the positive and negative charge transport layer in which the light-emitting region is interposed between the electron blocking region that blocks movement of electrons and the hole blocking region that blocks movement of holes.

Owing to the electron blocking region and the hole blocking region, holes propagated from the anode and electrons propagated from the cathode are trapped in the light-emitting region. This makes it possible to increase the probability of electron-hole recombination in the light-emitting region, thus decreasing a drive voltage for the organic EL element 1.

Moreover, the increase of the probability of electron-hole recombination in the light-emitting region enables an enhanced internal quantum efficiency and an enhanced luminous efficiency.

However, the positive and negative charge transport layer does not necessarily include both the electron blocking region and the hole blocking region. Even if the positive and negative charge transport layer includes either one of them, it is possible to sufficiently increase the probability of electron-hole recombination.

Therefore, according to the above method, it is possible to provide an organic electroluminescent element that realizes a high luminance, a high efficiency, and a long lifetime.

Additional objects, features, and strengths of the present invention will be made clear by the description below. Further, the advantages of the present invention will be evident from the following explanation in reference to the drawings.

Advantageous Effects of Invention

As described above, an organic electroluminescent element according to the present invention is an organic electroluminescent element including:

a positive and negative charge transport layer having a hole transporting capability and an electron transporting capability;

an anode;

a cathode; and a substrate, the positive and negative charge transport layer being interposed between the anode and the cathode, the positive and negative charge transport layer, the anode, and the cathode being stacked on the substrate, the positive and negative charge transport layer, which is a homojunction-type layer, including:

a light-emitting region which is doped with a light-emitting dopant, the positive and negative charge transport layer further including at least one of:

an electron blocking region, provided closer to the anode than the light-emitting region, having a lowest unoccupied molecular orbital an absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the positive and negative charge transport layer being formed to be a thin layer by reaction of at least one of organic material components for the positive and negative charge transport layer on a surface of the substrate or in a vapor phase.

As described above, a method for manufacturing an organic electroluminescent element according to the present invention is a method for manufacturing an organic electroluminescent element including a homojunction-type positive and negative charge transport layer having a hole transporting capability and an electron transporting capability interposed between an anode and a cathode, the method comprising:

(a) a step of forming the positive and negative charge transport layer, comprising the sub-steps of:

(i) forming a light-emitting region by doping a host material with a light-emitting dopant; and (ii) forming at least one of the following blocking regions: an electron blocking region, provided closer to the anode than the light-emitting region, having a lowest unoccupied molecular orbital absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the step (a) forming the positive and negative charge transport layer to be a thin layer by reaction of at least one of organic material components for the positive and negative charge transport layer on a surface of the substrate or in a vapor phase.

This makes it possible to provide an organic electroluminescent element that realizes a high luminance, a high efficiency, and a long lifetime.

DESCRIPTION OF EMBODIMENTS

[1] Overview of Organic EL Element

Figure 1:
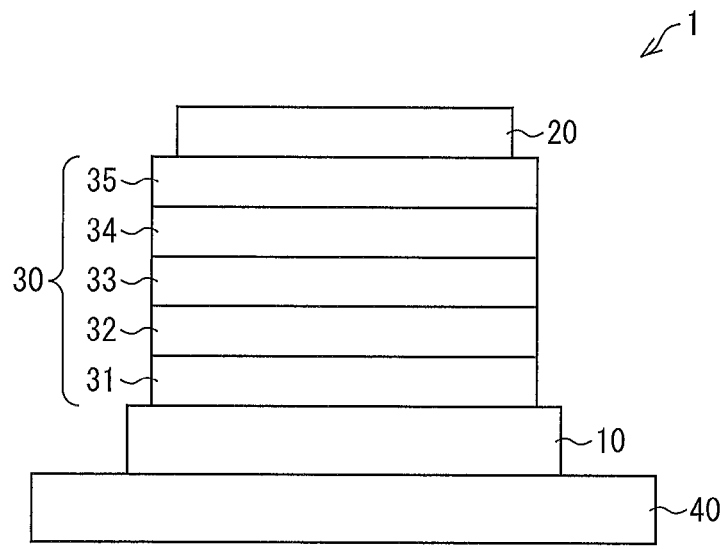
FIG. 1 is a cross-sectional view showing a cross section of an organic electroluminescent element according to an embodiment of the present invention.

An organic electroluminescent element (hereinafter referred to as "organic EL element") according to the present embodiment will be described with reference to FIG. 1. FIG. 1 is a cross-sectional view showing a cross-sectional view of an organic EL element 1.

As shown in FIG. 1, the organic EL element according to the present embodiment has the following configuration. That is, a structure in which a positive and negative charge transport layer (organic layer) 30 is interposed between an anode 10 and a cathode 20 is formed on a substrate 40. The positive and negative charge transport layer 30 has a hole transporting capability and an electron transporting capability.

In addition, the positive and negative charge transport layer 30 has a light-emitting region 33 doped with a light-emitting dopant. The organic EL element according to the present embodiment is configured so as to make holes and electrons effectively trapped in the light-emitting region 33. This configuration, of which details will be described later, is realized by such a structure that the light-emitting region 33 is interposed between an electron blocking region 32, which blocks movement of electrons, and a hole blocking region 34, which blocks movement of holes. This makes it possible to increase the probability of electron-hole recombination in the light-emitting region 33, while maintaining a high mobility of holes and electrons in the positive and negative charge transport layer 30.

(Positive and Negative Charge Transport Layer)

The following will describe further details of the configuration of the positive and negative charge transport layer of the organic EL element 1.

As shown in FIG. 1, the positive and negative charge transport layer 30 is separated into a hole injection transport region 31 (charge generation region), the electron blocking region 32, the light-emitting region 33, the hole blocking region 34, and an electron injection transport region 35 (charge generation region). In a direction from the anode 10 to the cathode 20, the hole injection transport region 31, the electron blocking region 32, the light-emitting region 33, the hole blocking region 34, and the electron injection transport region 35 are arranged in this order.

The hole injection transport region 31 propagates holes, which are injected from the anode 10 thereinto, to the light-emitting region 33 via the electron blocking region 32. Meanwhile, the electron injection transport region 6 propagates electrons, which are injected from the cathode 3 thereinto, to the light-emitting region 33 via the hole blocking region 34. The propagated holes and electrons are recombined with each other in the light-emitting region 33, which in turn causes light emission of the organic EL element 1.

(Host Material of the Positive and Negative Charge Transport Layer)

The positive and negative charge transport layer 30 is a homojunction layer.

The "homojunction layer" as used herein, which is a layer being interposed between the electrodes and constituted by a single matrix including the light-emitting region, has functions as a host layer for a host-to-guest-type organic EL emission and capabilities of injecting and transporting holes and electrons, i.e. positive and negative charges. One type of material is preferably used. However, this is not the only possibility. As described later, the host material may be composed of plural types of materials rather than one type of material. With this, hole mobility and electron mobility can be adjusted even with a compound having a low positive and negative charge transporting property in itself. Similarly, HOMO and LUMO levels, etc. can also be adjusted.

The host material for the positive and negative charge transport layer 30 is classified into low-molecular materials and high-molecular materials.

Examples of the low-molecular materials includes derivatives of benzofurans such as bis(carbazolyl)benzodifuran (CzBDF), cyclopentadiene derivatives, tetraphenylbutadiene derivatives, triphenylamine derivatives, oxadiazole derivatives, bathophenanthroline derivatives, pyrazoloquinoline derivatives, styrylbenzene derivatives, styrylarylene derivatives, aminostylyl derivatives, silole derivatives, thiophene ring compounds, pyridine ring compounds, perinone derivatives, perylene derivatives, oligothiophene derivatives, coumalin derivatives, rubrene derivatives, quinacridone derivatives, squalium derivatives, porphyrin derivatives, styryl-based coloring matter, tetracene derivatives, pyrazoline derivatives, trifumanylamine derivatives, anthracene derivatives, diphenylanthracene derivatives, pyrene derivatives, carbazole derivatives, oxadiazole dimer, pyrazoline dimer, aluminum-quinolinol complex, benzoquinolinol-beryllium complex, benzoxazole-zinc complex, benzothiazole-zinc complex, azomethyl-zinc complex, porphyrin-zinc complex, europium complexes, iridium complexes, platinum complexes, etc. and metal complexes having a metal such as aluminum (Al), zinc (Zn), beryllium (Be), platinum (Pt), iridium (Ir), terbium (Tb), europium (Eu), or dysprosium (Dy) as a central metal and having an oxadiazole, thiadiazole, phenylpyridine, phenylbenzoimidazole, quinoline structure, or the like as a ligand.

Examples of the high-molecular material include poly (oxadiazole) (Poly-OXZ), polystyrene derivatives (PSS), polyaniline-camphor sulfonic acid (PANI-CSA), poly(triphenylamine-oxadiazole) derivatives (poly-TPD-OXD), and poly(carbazol-triazol) derivatives (Poly-Cz-TAZ).

To obtain a high luminous efficiency, it is preferable to use a positive and negative charge transporting material having a singlet excitation level ($S_1$) higher than a triplet excitation level ($T_1$) of an organic light-emitting material. That is, it is more preferable that the relationship of $S_1 > T_1$ holds. This allows excitation energy to be trapped in a phosphorescent material.

Therefore, suitable as the positive and negative charge transporting material are (i) the following compounds having a high excitation level and a high hole mobility and their derivatives, (ii) the following compounds having a high electron mobility and their derivatives, and (iii) compounds containing the compounds (i) and the compounds (ii) as functional groups. Particularly, preferable are compounds containing, as functional groups, both the compounds having a high hole mobility and a high electron mobility and their derivatives. With this, hole mobility and electron mobility can be adjusted even with a compound having a low positive and negative charge transporting property in itself. Similarly, HOMO and LUMO levels, etc. can also be adjusted.

The material having a hole transporting capability has a property of transporting holes, a property of injecting holes, and a property of blocking electrons, regardless of whether the material is organic or inorganic. Examples of such material include aromatic tertiary amine compounds and styrylamine compounds, arylamine, porphyrin, carbazole, triazole, oxadiazole, imidazole, polyaryl alkane, pyrazolone and pyrazoline, phenylenediamine, amino-substituted chalcone, oxazole, styryl anthracene, fluorenone, hydrazone, stilbene, silazane, crosslinked siloxane, ethylene polymers containing TPD side chain group, ammonium compound-doped triphenylamine polymers, isoindole, polyisoindole, hexathienyl-benzene-based compounds, fluorine-containing arylamine polymers, NPD introduced heterocyclic ring, pyrazoline-based compounds, diphenylacetylene polymers, crosslinkable triphenylamine monomers, heat-resistant indolocarbazole derivatives, triphenylamine-based compounds, imide resin such as polyimide, chalcogenide-based compounds, fluorenyl group-containing compounds, conjugated polymers containing nitrogen and sulfur, carbazole-thiophene-based copolymers, PMMA-based polymers, spiro-TAD, TPD acrylate-based polymers, and their derivatives.

As a matter of course, the hole transporting material and its functional group having the property of transporting holes are not limited to the above-described substances.

The material having an electron transporting capability and its functional group have a property of transporting electrons, a property of injecting electrons, and a property of blocking holes, regardless of whether the material is organic or inorganic. Examples of such material and its functional group include oxadiazole, thiadiazole, quinoxaline, condensed polycyclic hydrocarbon compounds, condensed heterocyclic compounds, heterocyclic compounds, and polycyclic compounds. More specifically, examples of the condensed polycyclic hydrocarbon compounds include naphthalene, anthracene, tetracene, pentacene, pyrene, coronene, chrysene, diphenylanthracene, naphthacene, phenanthrene, and their derivatives. Examples of the condensed heterocyclic compounds include acridine, bathophenanthroline, phenanthroline, phenanthridine, quinoline, quinoxaline, phenazine, perylene, naphthaloperylene, and their derivatives. Examples of the heterocyclic compounds include bipyridine, fluorene, diphenylquinone, thiopyran, anthraquinodimethane, anthrone, fluorenylidenemethane, and their derivatives. Examples of polycyclic compounds include biphenyl, p-terphenyl, quaterphenyl, and their derivatives. Another examples include fluorescein, phthaloperylene, perinone, phthaloperynone, naphthaloperynone, diphenylbutadiene, tetraphenylbutadiene, aldazine, bisbenzoxazoline, bisstyryl, pyrazine, cyclopentadiene, oxine, aminoquinoline, imine, diphenylethylene, vinylanthracene, diaminocarbazole, pyran, thiopyran, polymethine, merocyanine, quinacridone, rubrene, carbodiimide, and their derivatives. As a matter of course, the electron transporting material and its functional group having the property of transporting electrons are not limited to the above-described substances.

(Light-Emitting Region of the Positive and Negative Charge Transport Layer)

The light-emitting region 33 in the positive and negative charge transport layer 30 is doped with an organic light-emitting material. In this case, it is preferable that the light-emitting region 33 is doped with the organic light-emitting material so that concentration of the organic light-emitting material to the positive and negative charge transporting material preferably ranges from approximately 1% to 20% by weight, more preferably approximately 6% by weight.

Further, it is more preferable that a concentration gradient of the organic light-emitting material continuously increases from respective end faces of the light-emitting region 33 on the electron blocking region 32 side and on the hole blocking region 34 side toward the center of the light-emitting region 33. If obviously separated layers of the organic light-emitting material are made in the light-emitting region 33, interfaces are generated in the light-emitting region 33. This may result in losses caused by difference in refractive index and mobility between materials of the separated layers. However, formation of the continuous concentration gradient of the organic light-emitting material eliminates obvious interfaces, thus reducing optical and electrical losses.

Provision of such a concentration gradient can be realized by means of cluster-type vacuum deposition equipment. However, it is preferable to use an in-line-type equipment capable of gradient doping with a material deposition rate maintained constant. This makes it possible to increase efficiency and reliability of a manufacturing process. Specifically, a region where two doped materials are present together is formed. This makes it possible to easily achieve the gradient doping from a mechanical viewpoint and to thus make the gradient.

As the organic light-emitting material, a publicly known organic light-emitting material for organic EL element can be used. Examples of the organic light-emitting material include fluorescent materials such as styryl derivatives, perylene, iridium complexes, coumalin derivatives, Lumogen F Red, dicyanomethylene pyran, phenoxazone, and polyphyllin derivatives, and phosphorescent organic metal complexes such as bis[(4,6-difluorophenyl)-pyridinato-N,C2']picolinate iridium(III)(FIrpic), tris(2-phenylpyridyl)iridium (III)(Ir(ppy)$_3$), tris (1-phenyl isoquinoline)iridium(III)(Ir(piq)$_3$), and tris((biphenylquinoxalinato)iridium(III)(Q3Ir). Among these substances, a phosphorescent material is preferably used for the purpose of dramatically reducing power consumption.

(Electron Blocking Region of the Positive and Negative Charge Transport Layer)

Figure 2:
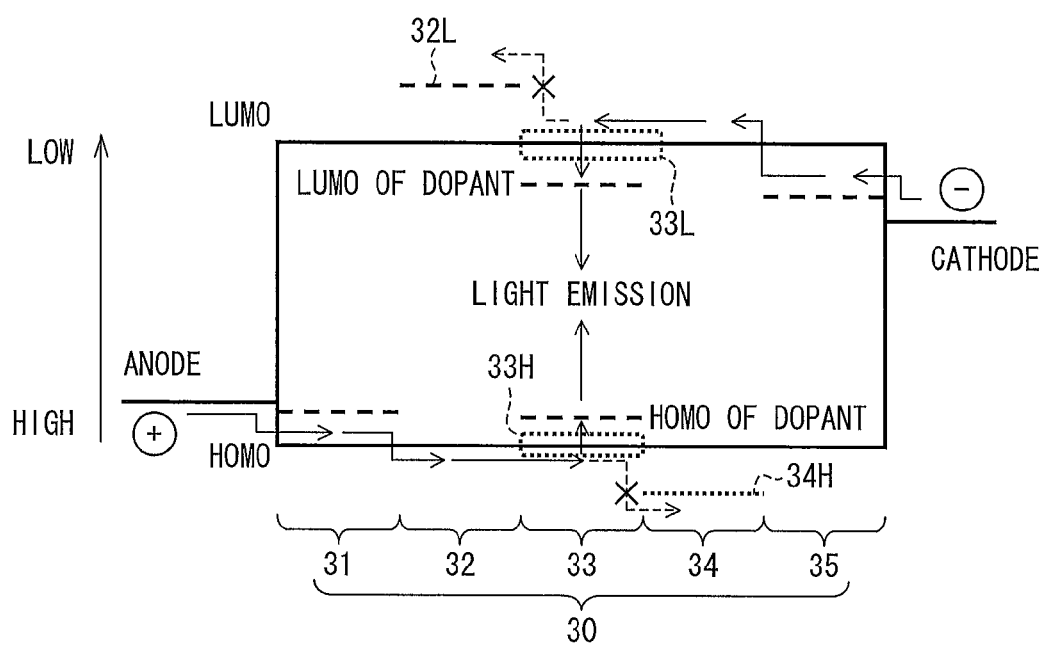
FIG. 2 is an energy diagram of regions constituting a positive and negative charge transport layer of an organic electroluminescent element according to one embodiment of the present invention.

As described above, in the organic EL element 1 according to the present embodiment, the electron blocking region 32 contributes to effective trapping of the holes and electrons in the light-emitting region 33. This will be described with reference to FIG. 2. FIG. 2 is a diagram showing the energy diagram of the regions that constitutes the positive and negative charge transport layer 30 of the organic EL element 1.

As shown in FIG. 2, the electron blocking region 32 has a lowest unoccupied molecular orbital (LUMO level) 32L lower than a lowest unoccupied molecular orbital 33L of the light-emitting region 33. This makes it possible to block the electrons having been propagated from the electron injection transport region 35 from passing through the light-emitting region 33 to the hole injection transport region 31 and the anode 10. That is, the electrons having been propagated from the electron injection transport region 35 stay in the light-emitting region 33. This makes it possible to trap the electrons in the light-emitting region 33, while the number of electrons passing through the light-emitting region 33 to the hole injection transport region 31 and the anode 10 is curbed as compared with the configuration in which the electron blocking region 32 is not provided.

More specifically, it is preferable that the lowest unoccupied molecular orbital (LUMO level) of the electron blocking region 32 is, as far as possible, lower than that of the light-emitting region 33. The difference in the lowest unoccupied molecular orbital between the electron blocking region 32 and the light-emitting region 33 is desired to be in the order of 0.1 eV, but preferably not less than 1 eV. In other words, it is preferable that an absolute value of the lowest unoccupied molecular orbital (LUMO level) of the electron blocking region 32 is, as far as possible, smaller than that of the lowest unoccupied molecular orbital (LUMO level) of the light-emitting region 33.

The capability of blocking electrons attributes to the presence of difference in LUMO between the host and the electron blocking region. Therefore, a specific numerical value of the lowest unoccupied molecular orbital (LUMO level) of the electron blocking region 32 cannot be determined by the electron blocking region 32 alone. This is because when the LUMO of the host increases and decreases, the LUMO level suitable for the electron blocking region increases and decreases accordingly.

Here, one example is taken with the assumption that the lowest unoccupied molecular orbital of the electron blocking region 32 is lower than that of the light-emitting region 33. In this case, the lowest unoccupied molecular orbital (LUMO level) of the electron blocking region 32 is in a range from 4.0 eV to 1.0 eV, and the lowest unoccupied molecular orbital of the light-emitting region 33 is in a range from 4.5 eV to 2.0 eV.

The electron blocking region 32 is formed by doping the aforementioned positive and negative charge transporting material with a dopant (electron blocking material).

Examples of the dopant (electronic blocking material) include 1,1-bis[4-[N,N-di(p-tolyl)amino]phenyl]cyclohexane, triarylamine derivatives, carbazole derivatives, crosslinked siloxane, ethylene polymers containing TPD side chain group, ammonium compound-doped triphenylamine polymers, isoindole, polyisoindole, hexathienylbenzene-based compounds, fluorine-containing arylamine polymers, NPD introduced heterocyclic ring, pyrazoline-based compounds, diphenylacetylene polymers, crosslinkable triphenylamine monomers, heat-resistant indolocarbazole derivatives, triphenylamine-based compounds, imide resin such as polyimide, chalcogenide-based compounds, fluorenyl group-containing compounds, conjugated polymers containing nitrogen and sulfur, carbazole-thiophene-based copolymers, PMMA-based polymers, spiro-TAD, and TPD acrylate-based polymers. Other than these substances, any materials used in general as the hole transporting material can be used.

If the positive and negative charge transport layer 30 is a gradient-doped layer, a continuous concentration gradient can be formed in the electron blocking region 32. If the positive and negative charge transport layer 30 is an obviously separated layer rather than a gradient-doped layer, interfaces are generated therein. This may result in losses caused by difference in refractive index and mobility between materials of the separated layers. However, formation of the continuous concentration gradient eliminates obvious interfaces, thus reducing optical and electrical losses.

(Hole Blocking Region of the Positive and Negative Charge Transport Layer)

As described above, in the organic EL element 1 according to the present embodiment, not only the electron blocking region 32 but also the hole blocking region 34 contributes to effective trapping of the holes and electrons in the light-emitting region 33.

As shown in FIG. 2, the hole blocking region 34 has a highest occupied molecular orbital (HOMO level) 34H higher than a highest occupied molecular orbital 33H of the light-emitting region 33. This makes it possible to block the holes having been propagated from the hole injection transport region 31 from passing through the light-emitting region 33 to the electron injection transport region 35 and the cathode 20. That is, the holes having been propagated from the hole injection transport region 31 stay in the light-emitting region 33. This makes it possible to trap the holes in the light-emitting region 33, while the number of holes passing through the light-emitting region 33 to the electron injection transport region 35 and the cathode 20 is curbed as compared with the configuration in which the hole blocking region 34 is not provided.

More specifically, it is preferable that the highest occupied molecular orbital (HOMO level) of the hole blocking region 34 is, as far as possible, higher than that of the light-emitting region 33. The difference in the highest occupied molecular orbital between the hole blocking region 34 and the light-emitting region 33 is desired to be at least in the order of 0.1 eV, but preferably not less than 1 eV. In other words, it is preferable that an absolute value of the highest occupied molecular orbital (HOMO level) of the hole blocking region 34 is, as far as possible, larger than that of the highest occupied molecular orbital (HOMO level) of the light-emitting region 33.

The capability of blocking holes attributes to the presence of difference in HOMO between the host and the hole blocking region. Therefore, a specific numerical value of the highest occupied molecular orbital (HOMO level) of the hole blocking region 34 cannot be determined by the hole blocking region 34 alone. This is because when the HOMO of the host increases and decreases, the HOMO level suitable for the hole blocking region increases and decreases accordingly.

Here, one example is taken with the assumption that the highest occupied molecular orbital of the hole blocking region 34 is higher than that of the light-emitting region 33. In this case, the highest occupied molecular orbital of the hole blocking region 34 is in a range from 5.5 eV to 7.5 eV, and the highest occupied molecular orbital of the light-emitting region 33 is in a range from 5.0 eV to 6.5 eV.

The hole blocking region 34 is formed by doping the aforementioned positive and negative charge transporting material with a dopant (hole blocking material).

Examples of the dopant (hole blocking material) includes styryl compounds, triazole derivatives, phenanthroline derivatives, oxadiazole derivatives, boron derivatives, anthraquinodimethane derivatives, diphenylquinone derivatives, perylenetetracarboxylic acid derivatives, PPV copolymer derivatives introduced cyano group, amorphous dimesitylboryl-containing compounds, gadolinium complex-doped TPD, fluorene-based copolymers, sexiphenyl compounds, and fluorinated dendrimer compounds. Other than these substances, any materials used in general as the electron transporting material can be used.

If the positive and negative charge transport layer 30 is a gradient-doped layer, a continuous concentration gradient can be formed in the hole blocking region 34. If the positive and negative charge transport layer 30 is an obviously separated layer rather than a gradient-doped layer, interfaces are generated therein. This may result in losses caused by difference in refractive index and mobility between materials of the separated layers. However, formation of the continuous concentration gradient eliminates obvious interfaces, thus reducing optical and electrical losses.

(The Hole Injection Transport Region of the Positive and Negative Charge Transport Layer)

The hole injection transport region 31 is a region closest to the anode 10 in the positive and negative charge transport layer 30.

The hole injection transport region 31 has a function of pulling out holes from the anode 10 to transport the holes to the light-emitting region 33. Therefore, it is possible to form the hole injection transport region 31 by doping the above-described host material with a p-type dopant.

As a specific p-type dopant, a publicly known p-type dopant can be used.

If the positive and negative charge transport layer 30 is a gradient-doped layer, a continuous concentration gradient can be formed in the hole injection transport region 31. If the positive and negative charge transport layer 30 is an obviously separated layer, interfaces are generated therein. This may result in losses caused by difference in refractive index and mobility between materials of the separated layers. However, formation of the continuous concentration gradient eliminates obvious interfaces, thus reducing optical and electrical losses.

(The Electron Injection Transport Region of the Positive and Negative Charge Transport Layer)

The electron injection transport region 35 is a region closest to the cathode 20 in the positive and negative charge transport layer 30.

The electron injection transport region 35 has a function of pulling out electrons from the cathode 20 to transport the electrons to the light-emitting region 33. Therefore, it is possible to form the electron injection transport region 35 by doping the above-described host material with an n-type dopant.

As a specific n-type dopant, a publicly known n-type dopant can be used.

(Substrate)

As described above, the organic EL element 1 of the embodiment of the present invention is configured in such a manner that the structure in which the positive and negative charge transport layer 30 is interposed between the anode 10 and the cathode 20 is formed on the substrate 40.

The substrate 40 may be anything as long as it has insulation property. A material to be used as the substrate 40 can be, but is not particularly limited to, a publicly known insulating material for substrate, for example.

Examples of the substrate 40 include an inorganic material substrate formed of glass, quartz, or the like material and a plastic substrate formed of polyethylene terephthalate, polyimide resin, or the like material. Another example of the substrate 40 includes substrates formed by coating surfaces of the metal substrate formed of aluminum (Al), iron (Fe), or the like material with an insulating material such as silicon oxide, organic insulating material, or the like. Still another example of the substrate 40 includes a substrate formed by subjecting surfaces of a metal substrate formed of Al or the like to insulation by anodic oxidation or the like method.

If light having been emitted from the light-emitting region 33 of the organic EL element 1 is extracted from the side opposite the substrate 40, i.e. if the organic EL element 1 is a top-emission organic EL element, the substrate 40 is desired to be formed of a material which does not transmit light. For example, a semiconductor substrate such as silicon wafer may be used. On the contrary, if light having been emitted from the light-emitting region 33 of the organic EL element 1 is extracted from the substrate 40 side, i.e. if the organic EL element 1 is a bottom-emission organic EL element, the substrate 40 is desired to be formed of a material which transmits light. For example, a glass substrate, a plastic substrate, or the like substrate may be used.

Further, the substrate 40 is preferably composed of a material having flexibility. When the substrate 40 is composed of a material having flexibility, it is possible to pack the organic EL element between two substrates including the substrate 40 by a roll-to-roll process. The roll-to-roll process of packing the organic EL element between two substrates including the substrate 40 is described in Japanese Patent Application No. 2009-175720 (filed on Jul. 28, 2009) (not published at the time of filing the present application), and the explanation thereof is therefore omitted here.

The use of the roll-to-roll process enables lowering device prices, and cost reduction is therefore expected, as compared with a vacuum deposition method employing a general, hitherto available, large glass substrate such as G6. Moreover, an element having formed therein a conventional flexible film which is interposed between glass substrates or other materials having a high oxygen and water vapor permeability was questionable in its reliability even if the element has an organic and inorganic multilayer film. However, the present invention eliminates the need for the formation of a barrier film layer having oxygen and water vapor permeability, and realizes a long-life element. Furthermore, forming the material for interposing of the flexible film into a non-planar shape allows the organic EL element part to have flexibility. This enables forming the element into various shapes for a local display device and others, which shows excellence in adaptability to the local device, design, and other properties.

Examples of such a material used for a resin film, which are non-limitative examples, include polyethylene terephthalate (PET), polyethylene naphthalate (PEN), polyether sulfone (PES), polyetherimide (PEI), polyether ether ketone (PEEK), polyphenylene sulfide (PPS), polyarylate (PAR), polyimide (PI), polycarbonate (PC), cellulose triacetate (TAC), cellulose acetate propionate (CAP), polyether sulfone (PES), cyclic olefin-based polymer, and wholly aromatic polyketone. Among these, polyethylene naphthalate (PEN) is preferable in terms of heat resistance, flatness, and others, when consideration is given to subjecting to a TFT process.

(Electrodes)

Next, the following will describe the electrodes. The electrodes included in the organic EL element 1 have only to function in a pair like the anode 10 and the cathode 20. Each of the electrodes may have a single-layer structure formed of one electrode material, or may be a multi-layer structure formed of multiple electrode materials. Examples of electrode materials to be used for the electrodes of the organic EL element 1 include publicly known electrode materials, which are non-limitative examples.

Examples of a material for the anode 10 include metals such as gold (Au), platinum (Pt), and nickel (Ni), and materials for transparent electrodes such as indium tin oxide (ITO), tin oxide ($SnO_2$), and indium zinc oxide (IZO).

On the other hand, examples of a material to be used for the cathode 20 include metals such as lithium (Li), calcium (Ca), cerium (Ce), barium (Ba), and aluminum (Al), and alloys containing these metals, such as an alloy of magnesium (Mg) and silver (Ag) and an alloy of Li and Ai.

Light having been emitted from the light-emitting region 33 of the organic EL element 1 requires extraction from either of the electrodes, the anode 10 and the cathode 20. In this case, it is preferable that an electrode material that transmits light is used for one of the electrodes, while an electrode material that does not transmit light is used for the other electrode. Examples of the electrode material that does not transmit light include materials for black electrodes, such as tantalum and carbon, and materials for reflective metal electrodes, such as Al, Ag, Au, an alloy of Al and Li, an alloy of Al and neodymium (Nd), and an alloy of Al and silicon (Si).

(Other Remarks)

Further, the organic EL element 1 of the present embodiment may be provided with at least one of the following components: a light diffusing section, a wavelength conversion layer, a color filter, and a circularly polarizing plate.

If two or more of these components are provided, it is preferable that the circularly polarizing plate, the color filter, the light diffusing section, and the wavelength conversion layer are provided in this order when viewed from a component closest to a light emission side of the organic EL element 1. However, this is not the only possibility. The following will describe details of these components.

(Light Diffusing Section)

The organic EL element 1 of the present embodiment may further have the light diffusing section on the light emission side of the organic EL element 1. Owing to the light diffusing section, light having been extracted from a light extraction side passes through the light diffusing section and uniformly diffuses from a light extraction surface.

The light diffusing section may be formed by filling a light diffusing resin on the light emission side of the organic EL element 1, or may be formed by providing a light diffusing plate on the light emission side of the organic EL element 1. Further, if light is extracted from the substrate 40 side, the substrate 40 itself may be formed of a material having light diffusing property.

A diffusion resin layer formed by filling a light diffusing resin on the light emission side of the organic EL element 1 is a binder resin containing a plurality of light diffusing particles. Examples of the binder resin include acrylic-based resin, polyester-based resin, polyolefin-based resin, and polyurethane-based resin. Examples of the light diffusing particles include (i) acrylic particles such as copolymers or ternary copolymers of methyl methacrylate, ethyl methacrylate, isobutyl methacrylate, normal butyl methacrylate, normal butyl methyl methacrylate, methyl acrylate, and/or methyl methacrylate, (ii) olefin-based particles such as polyethylene, polystyrene (PS), and polypropylene, and (iii) multilayer, multi-component particles obtained by forming particles of acryl-olefin-based copolymers or sole polymers and then coating surfaces of the particles with different kinds of monomers. In particular, polymethylmethacrylate (PMMA) is preferably used. Owing to the structure in which the binder resin contains a plurality of light-diffusing particles as described above, light passing through the diffusing resin layer can be diffused uniformly across the entire surface of the matrix. This allows an improved viewing angle and enhancement in light extraction efficiency, thus increasing luminance. The diffusion resin layer is in the order of 150 μm in thickness, for example.

Much the same effect of provision of the above-described light diffusing resin can be achieved with provision of the light diffusing plate on the light extraction side of the organic EL element 1. The light diffusing plate can be prepared with materials similar to those given as examples of the material for the binder resin constituting the light diffusing resin layer. Examples of the materials include acrylic resin containing dispersed light-diffusing particulates of crosslinked methyl polymethacrylate, crosslinked polystyrene, and/or the like substances.

Examples of the substrate 40 formed of a material having light diffusing property include a substrate formed by mixture of the material having light diffusing property. Examples of the material having light diffusing property include (i) acrylic particles such as copolymers or ternary copolymers of methyl methacrylate, ethyl methacrylate, isobutyl methacrylate, normal butyl methacrylate, normal butyl methyl methacrylate, methyl acrylate, and/or methyl methacrylate, (ii) olefin-based particles such as polyethylene, polystyrene (PS), and polypropylene, and (iii) multilayer, multi-component particles obtained by forming particles of acryl-olefin-based copolymers or sole polymers and then coating surfaces of the particles with different kinds of monomers. This realizes an organic EL device of a microcavity structure, thus allowing not only increased color purity and luminous efficiency but also a wide viewing angle.

(Wavelength Conversion Layer)

The organic EL element 1 of the present embodiment may further include a wavelength conversion layer on the light emission side of the organic EL element 1. Provision of the wavelength conversion layer achieves the effect of conversion to light of a desired wavelength.

The wavelength conversion layer is formed of inorganic fluorescent materials such as YAG-based fluorescent material, organic fluorescent materials typified by the materials for the aforementioned organic EL element, or other fluorescent materials, for example. The wavelength conversion layer has a thickness of the order of 100 μm, for example.

(Color Filter)

The organic EL element 1 of the present embodiment may further include a color filter provided on the light emission side of the organic EL element 1.

An organic compound used for a luminous object of an organic EL, as compared with an inorganic luminous object, has a broadened spectrum. This could be problematic in producing images of a high color purity. However, by using a color filter together with such an organic compound, it is possible to cut an undesired region of the spectrum and to thus obtain a spectrum with a narrow half-value breadth. Therefore, by mounting the organic EL element of the present embodiment in a display device, it is possible to provide a display device that displays high-quality images.

(Circularly Polarizing Plate)

The organic EL element 1 of the present embodiment may further include a circularly polarizing plate provided on the light emission side of the organic EL element 1. With this arrangement, it is possible to suppress reflection of extraneous light.

The circularly polarizing plate has a laminated structure comprising of a linearly polarizing plate and a phase difference plate functioning as a ¼λ plate. A right-hand circularly polarizing plate is obtained by applying a ¼ phase difference film onto the linearly polarizing plate in such a manner that an axis of the ¼ phase difference film tilts 45 degrees with respect to an absorption axis of the linearly polarizing plate. On the contrary, a left-hand circularly polarizing plate is obtained by applying the ¼ phase difference film onto the linearly polarizing plate in such a manner that the axis of the ¼ phase difference film tilts 135 degrees (−45 degrees) with respect to the absorption axis of the linearly polarizing plate. With this structure, light having transmitted through the polarizing plate turns to right-handed light when passing through the filter. The light is reflected by a glass surface to reverse its rotation direction, thus turning to left-handed light. Then, the light enters the circularly polarizing plate again. The circularly polarizing filter transmits right-handed light alone and absorbs left-handed light. Ultimately, reflected extraneous light becomes nearly zero. The circularly polarizing plate, owing to its nature, can eliminate harmful reflection of extraneous light from a TV monitor, a protection glass of a frame, etc.

The phase difference plate is a film with a birefringence index and can be prepared by stretching a plastic film in a specific direction. A material for the phase difference plate may be anything as long as it is transparent and impervious to a stretching process. Examples of the material for the phase difference plate include polycarbonate-based polymers, polyester-based polymers, polysulfone-based polymers, polystyrene-based polymers, polyphenylene oxide polymers, and polyolefin-based polymers.

(Operation Effects of the Organic EL Element)

As described previously, the organic EL element 1 of the present embodiment, as shown in FIG. 2, includes the positive and negative charge transport layer 30, wherein the positive and negative charge transport layer 30 includes: the electron blocking region 32, the hole blocking region 34, and the light-emitting region 33 which is provided between the electron blocking region 32 and the hole blocking region 34. The electron blocking region 32 has the lowest unoccupied molecular orbital (LUMO level) 32L lower than the lowest unoccupied molecular orbital 33L of the light-emitting region 33. The hole blocking region 34 has the highest occupied molecular orbital (HOMO level) 34H higher than the highest occupied molecular orbital 33H of the light-emitting region 33. Therefore, holes propagated from the hole injection transport region 31 and electrons propagated from the electron injection transport region 35 are trapped in the light-emitting region 33. This makes it possible to increase the probability of electron-hole recombination in the light-emitting region 33, thus decreasing a drive voltage for the organic EL element 1.

Moreover, the increase of the probability of electron-hole recombination in the light-emitting region 33 enables an enhanced internal quantum efficiency and an enhanced luminous efficiency.

However, the positive and negative charge transport layer 30 does not necessarily include both the electron blocking region 32 and the hole blocking region 34. Even if the positive and negative charge transport layer 30 includes either one of them, it is possible to sufficiently increase the probability of electron-hole recombination.

[2] Overview of Organic EL Display Device

Figure 3:
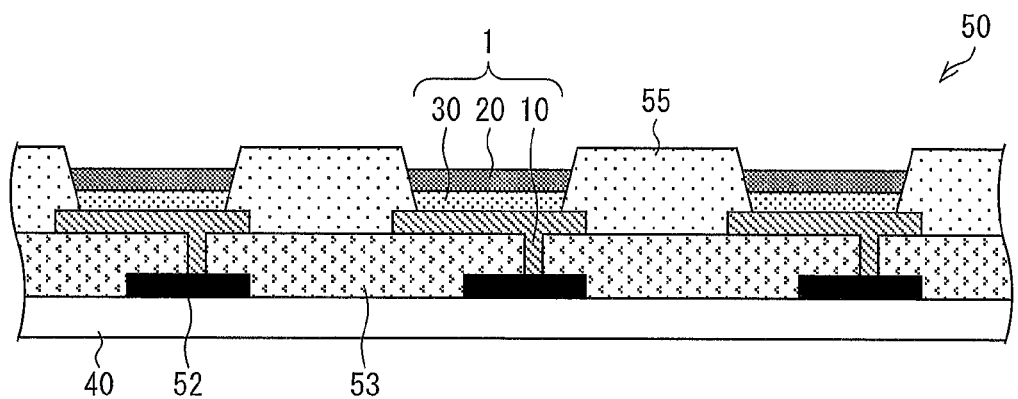
FIG. 3 is a cross-sectional view showing a cross section of an organic electroluminescent display device according to an embodiment of the present invention.

Overview of an organic electroluminescent display device (hereinafter referred to as "organic EL display device") 50 according to the present embodiment will be described with reference to FIG. 3. FIG. 3 is a view showing a cross-sectional view of the organic EL display device 50.

The organic EL display device 50, as shown in FIG. 3, includes a substrate 40, thin-film transistors (TFTs) 52, an interlayer insulating film 53, the anode 10 (electrode), an edge cover 55, the positive and negative charge transport layer 30 (organic layer), and the cathode 20 (electrode).

On the substrate 40, the TFTs 52 are provided so as to be spaced at a given interval. On the TFT 52, the flattened interlayer insulating film 53 is provided. The interlayer insulating film 53 has a contact hole, through which a terminal of the TFT 52 is electrically connected to the anode 4. On the anode 10, the positive and negative charge transport layer 30 and the cathode 20 are provided so as to be opposite to the TFT 2. The substrate 40, the anode 10, the positive and negative charge transport layer 30, and the cathode 20 constitute the above-described organic EL element 1. In the organic EL display device 50, the edge cover 55 is provided between the organic EL elements 1.

The substrate 40, the anode 10, the positive and negative charge transport layer 30, and the cathode 20 have been already explained in the above descriptions of the organic EL element, and explanations thereof are therefore omitted here.

(Thin-Film Transistors of the Organic EL Display Device)

The thin-film transistor (TFT) 52 has the function of working as a switching element of the organic EL element 1. Therefore, examples of a material for the TFT 52 include (i) inorganic semiconductor materials such as amorphous silicon, polycrystalline silicon, microcrystalline silicon, and cadmium selenide and (ii) organic semiconductor materials such as polythiophene derivatives and pentacene. For the TFT 52, a metal-insulator-metal (MIM) diode can be substituted.

(Interlayer Insulating Film of the Organic EL Display Device)

Examples of a material for the interlayer insulating film 53 include (i) inorganic materials such as silicon oxide and silicon nitride and (ii) organic resin materials such as acrylic resin, polyimide resin, photosensitive sol-gel material, and novolac resin. Examples of the acrylic resin include Optmer series manufactured by JSR Corporation. Examples of the polyimide resin include Photoneece® series of Toray Industries, Inc. However, if the organic EL display device 50 is a bottom-emission organic EL display device, the interlayer insulating film 53 needs to have a property of transmitting light. In this case, an opaque material such as polyimide resin is not suitable.

(Edge Cover of the Organic EL Display Device)

The edge cover 55 is provided between the organic EL elements 1. A part of the edge cover 55 is provided so as to partially cover the periphery of the anode 10 formed by patterning. Therefore, a region where the edge cover 55 is not provided on the anode 10 is the organic EL element 1. The edge cover 55, which is provided so as to cover the periphery of the anode 10, enables the prevention of shorting of the anode 10 and cathode 20 resulting from the thinning of the organic EL element 1 and the occurrence of electric field concentration in the periphery of the anode 10.

Examples of a material for the edge cover 55 include (i) inorganic materials such as silicon oxide and silicon nitride and (ii) organic resin materials such as acrylic resin, polyimide resin, photosensitive sol-gel material, and novolac resin. Examples of the acrylic resin include Optmer series manufactured by JSR Corporation. Examples of the polyimide resin include Photoneece® series of Toray Industries, Inc.

[3] Steps (1) for Manufacturing the Organic EL Element 1

The following will briefly describe steps for manufacturing the organic EL element 1. As described above, the organic EL element generally has a transistor as a switching element. However, a step of producing the transistor will not be mentioned below.

This section will describe a technique for forming the positive and negative charge transport layer 30 and the cathode 20 by co-evaporation. Co-evaporation sometimes means co-evaporation polymerization by which two kinds of highly reactive low-molecular materials (low-molecular monomers) are co-evaporated for polymerization on a subject surface to form a polymer thin layer. However, co-evaporation polymerization generally means a kind of vacuum vapor deposition, i.e. a technique for simultaneously heating and evaporating different kinds of materials to form a thin layer that is a mixture of the materials.

(Formation of the Anode)

A 25 mm-square glass substrate is used as the substrate 40, on which ITO is patterned to form the anode 10. The substrate 40 having the anode 10 formed thereon is washed so that the positive and negative charge transport layer 30 and the cathode 20 can be formed on the substrate 40 in the following steps.

(Formation of the Positive and Negative Charge Transport Layer)

(Formation of the Hole Injection Transport Region)

Firstly, a positive and negative charge transporting material, bis(carbazolyl)benzodifuran (CzBDF) (HOMO level=5.52 eV, LUMO level=2.20 eV), and a p-dopant, vanadium pentoxide ($V_2O_5$), are co-evaporated in thickness on the order of 20 nm in a doping ratio of 1.0:0.6. By such co-evaporation process, it is possible to form the hole injection transport region 31 (CzBDF: $V_2O_5$, HOMO level=4.7 eV, LUMO level=2.20 eV).

(Formation of the Electron Blocking Region)

Secondly, CzBDF and an electron blocking material, 1,1-bis[4-(di-p-tolyflaminophenyl]cyclohexane (TAPC), are co-evaporated in thickness on the order of 10 nm in a doping ratio of 1.0:0.1. By such co-evaporation process, it is possible to form the electron blocking region 32 (CzBDF+TAPC, HOMO level=5.52 eV, LUMO level=1.8 eV).

(Formation of the Light-Emitting Region)

Thirdly, a host material, CzBDF, is doped with a red phosphorescent guest material, tris (1-phenylisoquinoline)iridium ($Ir(piq)_3$) by 4.3% co-evaporation. This makes it possible to form the light-emitting region 33 of thickness on the order of 80 nm [CzBDF (HOMO level=5.52 eV, LUMO level=2.20 eV), $Ir(piq)_3$ (HOMO level=5.10 eV, LUMO level=2.45 eV)].

(Formation of the Hole Blocking Region)

Fourthly, a host material, CzBDF, and a hole blocking material, 4,7-diphenyl-1,10-phenanthrolin (Bphen) are co-evaporated in thickness on the order of 10 nm in a doping ratio of 1.0:0.5. This makes it possible to form the hole blocking region 34 (CzBDF+Bphen, HOMO level=6.1 eV, LUMO level=2.20 eV).

(Formation of the Electron Injection Transport Region)

Fifthly, a host material, CzBDF, and an n-dopant, metal cesium (Cs), are co-evaporated in thickness on the order of 10 nm in a doping ratio of 1.0:0.1. By such co-evaporation process, it is possible to form the electron injection transport region 35 (CzBDF:Cs, HOMO level=5.52 eV, LUMO level=2.14 eV).

(Formation of the Cathode)

Finally, aluminum is deposited in thickness of 80 nm on the surface of the electron injection transport region 35, thereby forming the electrode (cathode 20) having reflectivity.

As to the positive and negative charge transporting material, CzBDF, its hole mobility is $3.7 \times 10^{-3}$ cm$^2$/Vs (when electric field intensity is $2.5 \times 10^5$ V/cm), and its electron mobility is $4.4 \times 10^{-3}$ cm$^2$/Vs (when electric field intensity is $2.5 \times 10^5$ V/cm).

As to the organic EL element obtained by the manufacturing method described in this section, its luminance is 16,000 candelas/m$^2$, and its luminous efficiency was 24 candelas/A.

[4] Steps (2) for Manufacturing the Organic EL Element 1

In this section, unlike the steps (1) as described above, the organic EL element 1 is formed by vapor deposition polymerization or the like method, using an organic EL material derivative having an alkenyl group or an alkynyl group.

Vapor deposition polymerization refers to a polymer thin film forming method by which highly reactive low-molecular monomers of the same kind or of different kinds (generally two kinds) are polymerized by vapor deposition onto the substrate surface in a vacuum ranging from $10^{-2}$ Pa to $10^{-8}$ Pa. Polymerization reaction sequentially takes place on the substrate surface. By adjustments of various conditions such as a heating temperature of the substrate, it is possible to control alignment directions, i.e. to control whether molecular axes of the polymers are to be aligned in a vertical direction or a horizontal direction with respect to the substrate.

Further, vapor deposition of the organic material onto the substrate in a vacuum may be carried out simultaneously with or followed by exposure to electron beam or ultraviolet light. This heats the substrate and thus uniformizes temperatures of the substrate surface. Moreover, after the exposure to electron beam or ultraviolet light, heat treatment may be carried out.

There are the following two methods: (1) a method of co-evaporating a low-molecular material having functional groups such as an amino group, a hydroxyl group, an isocyanate group, acid anhydride, alkenyl, and/or an alkynyl group for addition polymerization or condensation polymerization, and (2) a method of activating a single monomer for ionic polymerization or free-radical polymerization. Further, it is possible to form a thin layer of π-conjugated polymer. By the method (1), polyimide, polyurea, polyurethane, or the like can be obtained.

Examples of the alkenyl group generally include an ethenyl group, a vinyl group, and an allyl group. Examples of the alkynyl group include terminal alkynes, such as an ethynyl group, a propynyl group, and a propargyl group (trivial name), and internal alkynes.

Note that the organic EL material derivative is confirmed to polymerize at temperatures on the order of 230° C. The organic EL material derivative almost quantitatively reacts by maintaining the substrate heating temperature of the vapor deposition apparatus at temperatures higher than 230° C. This can be confirmed by UV absorption spectrum showing that polymerization takes place with loss of a triple bond and change to a double bond.

(Formation of the Anode)

A 25 mm-square glass substrate is used as the substrate 40, on which ITO is patterned to form the anode 10. The substrate 40 having the anode 10 formed thereon is washed so that the positive and negative charge transport layer 30 and the cathode 20 can be formed on the substrate 40 in the following steps.

(Formation of the Positive and Negative Charge Transport Layer)

By using a vapor deposition apparatus equipped with a substrate heating device, the following steps will be carried out under such environments that a vacuum is $4 \times 10^{-4}$ Pa and that a substrate temperature is maintained at around 250° C.

(Formation of the Hole Injection Transport Region)

A positive and negative charge transporting material, bis (4-ethynylcarbazolyl)benzodifuran (4ECzBDF), and a p-dopant, vanadium pentoxide ($V_2O_5$), are co-evaporated in thickness on the order of 20 nm in a doping ratio of 1.0:0.6. By such co-evaporation process, it is possible to form the hole injection transport region 31 (4ECzBDF: $V_2O_5$, HOMO level=4.7 eV, LUMO level=2.20 eV).

(Formation of the Electron Blocking Region)

Secondly, a host material, 4ECzBDF, and an electron blocking material, 1,1-bis[4-(di-p-styly)aminophenyl]cyclohexane (SAPC), are co-evaporated in thickness on the order of 10 nm in a doping ratio of 1.0:0.1. By such co-evaporation process, it is possible to form the electron blocking region 32 (4ECzBDF+SAPC, HOMO level=5.52 eV, LUMO level=1.8 eV).

(Formation of the Light-Emitting Region)

Thirdly, a host material, 4ECzBDF, is doped with a red phosphorescent guest material, tris(1-(4-etynyl)phenylisoquinoline)iridium (Ir(Epiq)$_3$) by 4.3% co-evaporation. This makes it possible to form the light-emitting region 33 of thickness on the order of 80 nm [CzBDF (HOMO level=5.52 eV, LUMO level=2.20 eV), Ir(Epiq)$_3$ (HOMO level=5.10 eV, LUMO level=2.45 eV)].

(Formation of the Hole Blocking Region)

Fourthly, a host material, 4ECzBDF, and a hole blocking material, 3,8-dietynyl-4,7-diphenyl-1,10-phenanthrolin (DBphen) (HOMO level=6.1 eV) are co-evaporated in thickness on the order of 10 nm in a doping ratio of 1.0:0.5. This makes it possible to form the hole blocking region 34 (4ECzBDF+DBphen, HOMO level=6.1 eV, LUMO level=2.20 eV).

(Formation of the Electron Injection Transport Region)

Fifthly, a host material, 4ECzBDF, and an n-dopant, metal cesium (Cs), are co-evaporated in thickness on the order of 10 nm in a doping ratio of 1.0:0.1. This makes it possible to form the electron injection transport region 35 (4ECzBDF:Cs, HOMO level=5.52 eV, LUMO level=2.14 eV).

(Formation of the Cathode)

Finally, aluminum is deposited in thickness of 80 nm on the surface of the electron injection transport region 35, thereby forming the electrode (cathode 20) having reflectivity.

Using the materials having ethenyl group, 4ECzBDF, SAPC, Ir(Epiq)$_3$, and DBphen, vapor deposition polymerization was carried out at temperatures on the order of 240° C., 200° C., 210° C., and 230° C., respectively. By thermal gravimetric analysis (TGA), it was confirmed that each single polymer layer thus obtained decreased only by less than 5% by weight even if the polymer layer was held at approximately 290° C. for 40 minutes. Therefore, as to the polymerization materials to be subjected to vapor deposition under the conditions in this section, as soon as the materials reach the surface of the substrate 40, vapor deposition polymerization takes place between molecules of the same kind or between molecules of different kinds.

As to the positive and negative charge transporting material to be used for a layer formed in vapor deposition polymerization, 4ECzBDF, its hole mobility is $4.0 \times 10^{-3}$ cm$^2$/Vs (when electric field intensity is $2.5 \times 10^5$ V/cm), and its electron mobility is $4.8 \times 10^{-3}$ cm$^2$/Vs (when electric field intensity is $2.5 \times 10^5$ V/cm).

As to the organic EL element obtained by the manufacturing method described in this section, its luminance is 20,000 candelas/m$^2$, and its luminous efficiency was 30 candelas/A.

The present invention is not limited to the aforementioned embodiments and is susceptible of various changes within the scope of the accompanying claims. Also, embodiments obtained by the changes are also included within the technical scope of the present invention.

[5] Organic EL Element of a Comparative Configuration

Finally, the following will briefly describe, as a comparative configuration, a configuration of an organic EL element containing no electron blocking region and no hole blocking region and show its performance.

Figure 4:
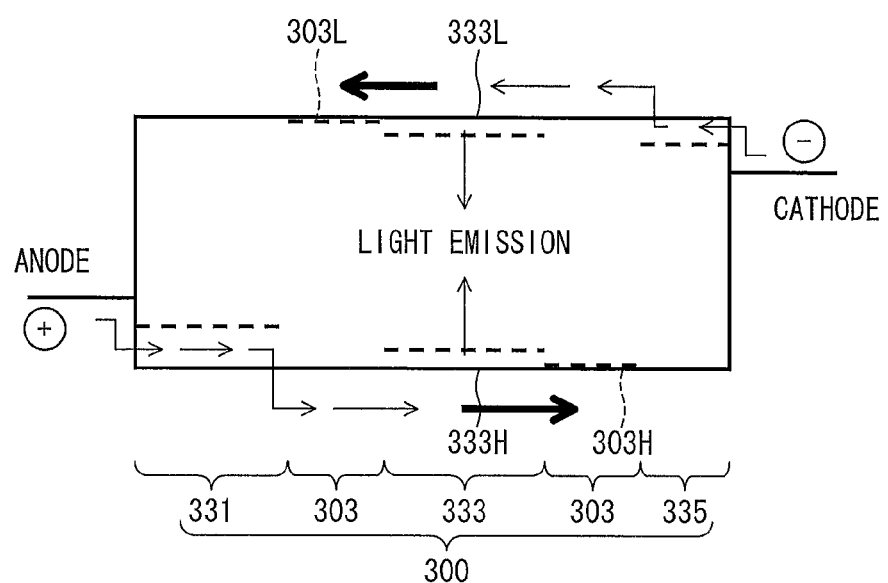
FIG. 4 is an energy diagram of regions constituting a positive and negative charge transport layer of an organic EL element of a comparative configuration.
Figure 5:
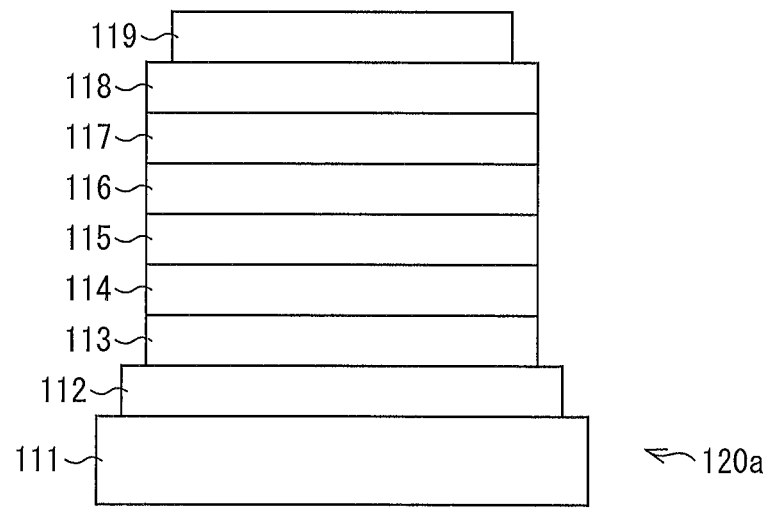
FIG. 5 is a view showing the conventional configuration.
Figure 6:
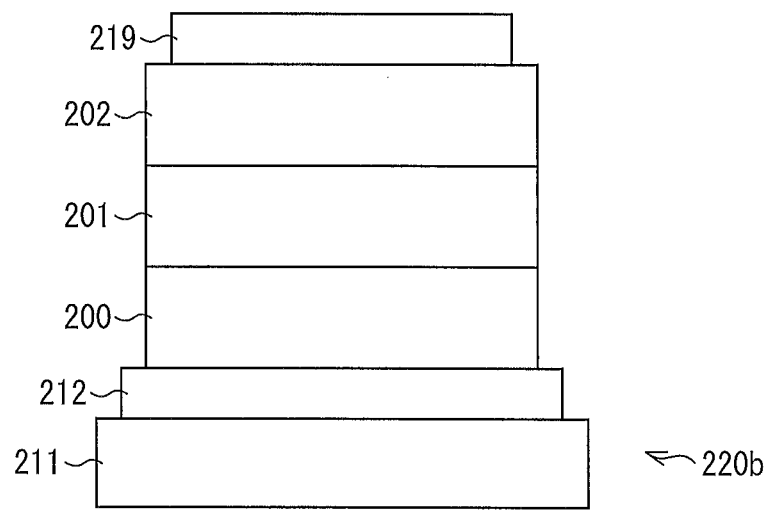
FIG. 6 is a view showing the conventional configuration.

FIG. 4 is a view showing an energy diagram of regions constituting a positive and negative charge transport layer in the organic EL element of the comparative configuration.

In the organic EL element of the comparative configuration, regions 303 (in FIG. 4) are provided instead of the electron blocking region and the hole blocking region, which have been described in the aforementioned embodiment. That is, as shown in FIG. 4, the regions 303 that are not doped with anything and composed of a host material alone are formed between an electron injection transport region 335 and a light-emitting region 333 and between a hole injection transport region 331 and the light-emitting region 333 in a positive and negative charge transport layer 300.

Steps for manufacturing the organic EL element of the comparative configuration are as follows.

Using an ITO-formed substrate as an anode, a host material, CzBDF, and a p-dopant, vanadium pentoxide (V$_2$O$_5$), are co-evaporated (20 nm, a doping ratio of 1.0:0.6) onto the substrate to form the hole injection transport region 331.

Secondly, the host material, CzBDF, alone is deposited in thickness of 10 nm to form the region 303 composed of the host material alone.

Thirdly, the host material, CzBDF, is doped with a red phosphorescent guest material, tris(1-phenyl-isoquinoline) iridium (ir(piq)$_3$) by 4.3% co-evaporation to form the light-emitting region 333 having a thickness of 80 nm (in FIG. 4).

Fourthly, the host material, CzBDF, alone is deposited in thickness of 10 nm to form the region 303 composed of the host material alone.

Fifthly, the host material, CzBDF, and an n-dopant, metal cesium (Cs), are co-evaporated (10 nm, a doping ratio of 1.0:0.1) to form the electron injection transport region 335.

Finally, aluminum is deposited in thickness of 80 nm on the surface of the electron injection transport region 335, thereby forming the electrode (cathode) having reflectivity.

The organic EL element of the comparative configuration manufactured by the above method lacks the electron blocking region. As shown in FIG. 4, a lowest unoccupied molecular orbital 333L of the light-emitting region 333 is almost equal to a lowest unoccupied molecular orbital 303L of the region 303 composed of the host material alone. This flows electrons toward the hole injection transport region and results in a failure to obtain the effect of efficiently trapping excitons. Further, the organic EL element of the comparative configuration also lacks the hole blocking region. A highest occupied molecular orbital 333H of the light-emitting region 333 is almost equal to a highest occupied molecular orbital 303H of the region 303 composed of the host material alone. This flows holes toward the electron injection transport region and results in a failure to obtain the effect of efficiently trapping excitons. Therefore, the comparative configuration is lower in probability of hole-electron recombination in the light-emitting region 33 than the configuration of the present embodiment, which makes it impossible to decrease a drive voltage for the organic EL element. Moreover, a low probability of hole-electron recombination in the light-emitting region 33 results in a low internal quantum efficiency and a low luminous efficiency.

In fact, as to the organic EL element of the comparative configuration manufactured by the above method, its luminance was 5000 candelas/m$^2$, and its luminous efficiency was 12 candelas/A.

The present invention is not limited to the aforementioned embodiments and is susceptible of various changes within the scope of the accompanying claims. That is, a new embodiment can be obtained by suitable combinations of technical means changed within the accompanying claims. Specific embodiments or examples implemented in the description of the embodiments only show technical features of the present invention and are not intended to limit the scope of the invention. Variations can be effected within the spirit of the present invention and the scope of the following claims.

(Outline of the Present Invention)

As described above, an organic electroluminescent element according to the present invention is an organic electroluminescent element including:

a positive and negative charge transport layer having a hole transporting capability and an electron transporting capability;

an anode;

a cathode; and a substrate, the positive and negative charge transport layer being interposed between the anode and the cathode, the positive and negative charge transport layer, the anode, and the cathode being stacked on the substrate, the positive and negative charge transport layer, which is a homojunction-type layer, including:

a light-emitting region which is doped with a light-emitting dopant, the positive and negative charge transport layer further including at least one of:

an electron blocking region, provided closer to the anode than the light-emitting region, having a lowest unoccupied molecular orbital an absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the positive and negative charge transport layer being formed to be a thin layer by reaction of at least one of organic material components for the positive and negative charge transport layer on a surface of the substrate or in a vapor phase.

According to the above configuration, the organic electroluminescent element according to the present invention is such that the positive and negative charge transport layer has the light-emitting region and at least one of the electron blocking region that blocks movement of electrons and the hole blocking region that blocks movement of holes.

Therefore, holes propagated from the anode and electrons propagated from the cathode are trapped in the light-emitting region. This makes it possible to increase the probability of electron-hole recombination in the light-emitting region, thus decreasing a drive voltage for the organic EL element 1.

Moreover, the increase of the probability of electron-hole recombination in the light-emitting region enables an enhanced internal quantum efficiency and an enhanced luminous efficiency.

However, the positive and negative charge transport layer does not necessarily include both the electron blocking region and the hole blocking region. Even if the positive and negative charge transport layer includes either one of them, it is possible to sufficiently increase the probability of electron-hole recombination.

Therefore, it is possible to provide an organic electroluminescent element that realizes a high luminance, a high efficiency, and a long lifetime.

Note that the homojunction-type layer herein may be composed of a single host material or multiple host materials. Details will be described later.

In addition to the above configuration, the organic electroluminescent element according to the present invention is such that the blocking regions can be formed by vapor deposition polymerization.

The blocking regions can be formed by a relatively simple method called vapor deposition polymerization.

In addition to the above configuration, the organic electroluminescent element according to the present invention is preferably such that the positive and negative charge transport layer has a hole mobility and an electron mobility that satisfy the following condition:

hole mobility/electron mobility=0.01 to 1.

This realizes a balance between hole mobility and electron mobility and prevents the occurrence of a phenomenon often caused by the conventional organic EL element, i.e. the phenomenon that there are redundant electrical charges without being recombined with each other due to injections of positive and negative charges in unbalanced proportions. As a result, light is emitted in such a state that positive and negative charges are recombined with each other without being wasted. This achieves luminous efficiency higher than that of the conventional organic EL element.

However, the above-described host material is not the only possibility. It is preferable that the positive and negative charge transport layer has a hole mobility and an electron mobility both of which are at least $1 \times 10^{-6}$ cm$^2$/Vs.

This realizes a high hole mobility and a high electron mobility and prevents the occurrence of a phenomenon often caused by the conventional organic EL element, i.e. the phenomenon that there are redundant electrical charges without being recombined with each other due to injections of positive and negative charges in unbalanced proportions. As a result, light is emitted in such a state that positive and negative charges are recombined with each other without being wasted. This achieves luminous efficiency higher than that of the conventional organic EL element.

In addition to the above configuration, the organic electroluminescent element according to the present invention is preferably such that the substrate on which the positive and negative charge transport layer, the cathode, and the anode are stacked is composed of a material having flexibility.

Because the substrate has flexibility, it is possible to form the organic EL element by the roll-to-roll process. This allows reduction of initial costs for equipment introduction, running costs, and other costs. By packing the substrate between two other substrates or the like of low oxygen and water permeability, it is possible to manufacture, as one form of the organic EL element including the flexible substrate, a low-cost organic EL element that eliminates the need for an organic or inorganic multilayer film, etc.

In addition to the above configuration, the organic electroluminescent element according to the present invention is preferably such that out of the anode and cathode, the electrode located on a side opposite to a light extraction side of the organic electroluminescent element is composed of a material having a property of reflecting light.

This makes it possible to efficiently take light from the light-emitting region out of the organic electroluminescent element.

In addition to the above configuration, the organic electroluminescent element according to the present invention is preferably such that out of the anode and the cathode, the electrode located on the light extraction side is a transparent electrode or a translucent electrode.

This makes it possible to efficiently take light from the light-emitting region out of the organic electroluminescent element.

Further, with the configuration in which the electrode located on the light extraction side is a transparent electrode or a translucent electrode, light is collected by a microcavity effect. This makes it possible to enhance a luminous efficiency, to increase a color purity, and to allow light to have directivity and/or other properties.

Still further, as to the organic EL element, its light intensity has a luminous distribution close to an isotropic Lambert distribution. However, it is possible to collect light by making use of the microcavity effect obtained by holding the organic light-emitting layer between the reflective electrode and the transparent electrode.

With the configuration in which the translucent electrode is provided on the light extraction side that is a light release surface, multiple reflections and interferences, i.e. repeated reflections between the upper and lower electrodes take place, thus producing resonance and emphasis. By extracting only such light that its wavelength matches an optical path length between the anode and the cathode, it is possible to enhance luminance. This weakens undesired light that deviates from the optical path length, and produces a steep spectrum of the light taken out. Because of this, color purity increases. Also, it is possible to allow light to have directivity.

Light beams of RGB colors have mutually different wavelengths. This requires individual adjustment in layer thickness of the transparent or translucent electrode for each light source.

In addition to the above configuration, the organic electroluminescent element according to the present invention is preferably such that a light diffusing resin is filled on the light extraction side.

With the configuration in which the light diffusing resin is filled on the light extraction side, the light to be extracted to the light extraction side passes through a part where a diffusing resin is filled and is then diffused uniformly from the light extraction surface.

The organic EL luminous object may be provided with the light diffusing resin layer having a light diffusing function on the light extraction side (for the bottom-emission organic EL element, on the matrix side). The diffusion resin layer is a binder resin containing a plurality of light diffusing particles.

Examples of the binder resin include acrylic resin, polyester-based resin, polyolefin-based resin, and polyurethane-based resin. Examples of the light diffusing particles include (i) acrylic particles such as copolymers or ternary copolymers of methyl methacrylate, ethyl methacrylate, isobutyl methacrylate, normal butyl methacrylate, normal butyl methyl methacrylate, methyl acrylate, and/or methyl methacrylate, (ii) olefin-based particles such as polyethylene, polystyrene (PS), and polypropylene, and (iii) multilayer, multi-component particles obtained by forming particles of acryl-olefin-based copolymers or sole polymers and then coating surfaces of the particles with different kinds of monomers. In particular, polymethylmethacrylate (PMMA) is preferably used. Owing to the structure in which the binder resin contains a plurality of light-diffusing particles as described above, light passing through the diffusing resin layer can be diffused uniformly across the entire surface of the matrix. This allows an improved viewing angle and enhancement in light extraction efficiency, thus increasing luminance. The diffusion resin layer is in the order of 150 μm in thickness, for example.

In addition to the above configuration, the organic electroluminescent element according to the present invention preferably includes a light diffusing plate provided on the light extraction side.

Much the same effect of provision of the above-described light diffusing resin can be achieved with provision of the light diffusing plate on the light extraction side of the organic EL luminous object. The light diffusing plate can be prepared with materials similar to those given as examples of the material for the binder resin constituting the light diffusing resin layer. Examples of the materials include acrylic resin containing dispersed light-diffusing particulates of crosslinked methyl polymethacrylate, crosslinked polystyrene, and/or the like substances.

In addition to the above configuration, the organic electroluminescent element according to the present invention is preferably such that the substrate is composed of a material having a property of diffusing light.

For example, the substrate can be a substrate formed by mixture of a material having light diffusing property. Examples of the material having light diffusing property include (i) acrylic particles such as copolymers or ternary copolymers of methyl methacrylate, ethyl methacrylate, isobutyl methacrylate, normal butyl methacrylate, normal butyl methyl methacrylate, methyl acrylate, and/or methyl methacrylate, (ii) olefin-based particles such as polyethylene, polystyrene (PS), and polypropylene, and (iii) multilayer, multi-component particles obtained by forming particles of acryl-olefin-based copolymers or sole polymers and then coating surfaces of the particles with different kinds of monomers. This realizes an organic EL device of a microcavity structure, thus allowing not only increased color purity and luminous efficiency but also a wide viewing angle.

In addition to the above configuration, the organic electroluminescent element according to the present invention is preferably such that the positive and negative charge transport layer has a charge generation region.

With this configuration, the holes having been propagated from the anode and the electrons having been propagated from the cathode can be efficiently propagated to the light-emitting region.

Examples of a material for the charge generation region include vanadium pentoxide ($V_2O_5$). When the charge generation region is formed in the organic EL layer and an equipotential surface is formed between adjacent light-emitting layers, a drive voltage increases, but a small amount of current flows. This allows an excellent lifetime of light emission. The charge generation region has a thickness of the order of 20 nm, for example.

In addition to the above configuration, the organic electroluminescent element according to the present invention preferably includes a wavelength conversion layer provided on the light extraction side.

Further, when the wavelength conversion layer for converting wavelengths of light is provided on the light extraction side, it is possible to achieve the effect of conversion to light of a desired wavelength.

The wavelength conversion layer is formed of inorganic fluorescent materials such as YAG-based fluorescent material, organic fluorescent materials typified by the materials for the aforementioned organic EL element, or other fluorescent materials, for example. The wavelength conversion layer has a thickness of the order of 100 μm, for example.

In addition to the above configuration, the organic electroluminescent element according to the present invention preferably further include a circularly polarizing plate.

With provision of the circularly polarizing plate, it is possible to suppress reflection of extraneous light.

The circularly polarizing plate has a laminated structure comprising of a linearly polarizing plate and a phase difference plate functioning as a ¼λ plate. A right-hand circularly polarizing plate is obtained by applying a ¼ phase difference film onto the linearly polarizing plate in such a manner that an axis of the ¼ phase difference film tilts 45 degrees with respect to an absorption axis of the linearly polarizing plate. On the contrary, a left-hand circularly polarizing plate is obtained by applying the ¼ phase difference film onto the linearly polarizing plate in such a manner that the axis of the ¼ phase difference film tilts 135 degrees (−45 degrees) with respect to the absorption axis of the linearly polarizing plate. With this structure, light having transmitted through the polarizing plate turns to right-handed light when passing through the filter. The light is reflected by a glass surface to reverse its rotation direction, thus turning to left-handed light. Then, the light enters the circularly polarizing plate again. The circularly polarizing filter transmits right-handed light alone and absorbs left-handed light. Ultimately, reflected extraneous light becomes nearly zero. The circularly polarizing plate, owing to its nature, can eliminate harmful reflection of extraneous light from a TV monitor, a protection glass of a frame, etc.

The phase difference plate is a film with a birefringence index and can be prepared by stretching a plastic film in a specific direction. A material for the phase difference plate may be anything as long as it is transparent and impervious to a stretching process. Examples of the material for the phase difference plate include polycarbonate-based polymers, polyester-based polymers, polysulfone-based polymers, polystyrene-based polymers, polyphenylene oxide polymers, and polyolefin-based polymers.

In addition to the above configuration, the organic electroluminescent element according to the present invention preferably includes a color filter provided on the light extraction side.

An organic compound used for a luminous object of an organic EL, as compared with an inorganic luminous object, has a broadened spectrum. This could be problematic in producing images of a high color purity. However, by using a color filter together with such an organic compound, it is possible to cut an undesired region of the spectrum and to thus obtain a spectrum with a narrow half-value breadth. Therefore, by mounting the organic electroluminescent element of the present invention in a display device, it is possible to provide a display device that displays high-quality images.

By the introduction of the color filter, it is possible to achieve the effect of suppressing or reducing reflection of extraneous light. The color filter is less effective than the circularly polarizing plate in suppressing reflection of extraneous light. However, as described above, the color filter can remove wavelengths of an undesired region of light produced by the organic EL and simultaneously achieve the effect of increasing color purity. Moreover, the color filter exerts a great effect when introduced into a product due to its higher light extraction efficiency and relatively higher luminous efficiency, as compared with the circularly polarizing plate.

Further, the present invention encompasses an organic electroluminescent display device including: display means having an organic electroluminescent element with the above-described configuration formed on a thin-film transistor substrate.

In order to solve the above problems, a method for manufacturing an organic electroluminescent element according to the present invention is a method for manufacturing an organic electroluminescent element including a homojunction-type positive and negative charge transport layer having a hole transporting capability and an electron transporting capability interposed between an anode and a cathode, the method comprising:

(a) a step of forming the positive and negative charge transport layer, comprising the sub-steps of:

(i) forming a light-emitting region by doping a host material with a light-emitting dopant; and (ii) forming at least one of the following blocking regions: an electron blocking region, provided closer to the anode than the light-emitting region, having a lowest unoccupied molecular orbital absolute value of which is smaller than that of the lowest unoccupied molecular orbital of the light-emitting region; and a hole blocking region, provided closer to the cathode than the light-emitting region, having a highest occupied molecular orbital an absolute value of which is larger than that of the highest occupied molecular orbital of the light-emitting region, the step (a) forming the positive and negative charge transport layer to be a thin layer by reaction of at least one of organic material components for the positive and negative charge transport layer on a surface of the substrate or in a vapor phase.

According to the above method for manufacturing an organic electroluminescent element, it is possible to provide an organic electroluminescent element including the positive and negative charge transport layer in which the light-emitting region is interposed between the electron blocking region that blocks movement of electrons and the hole blocking region that blocks movement of holes.

Owing to the electron blocking region and the hole blocking region, holes propagated from the anode and electrons propagated from the cathode are trapped in the light-emitting region. This makes it possible to increase the probability of electron-hole recombination in the light-emitting region, thus decreasing a drive voltage for the organic EL element 1.

Moreover, the increase of the probability of electron-hole recombination in the light-emitting region enables an enhanced internal quantum efficiency and an enhanced luminous efficiency.

However, the positive and negative charge transport layer does not necessarily include both the electron blocking region and the hole blocking region. Even if the positive and negative charge transport layer includes either one of them, it is possible to sufficiently increase the probability of electron-hole recombination.

Therefore, according to the above method, it is possible to provide an organic electroluminescent element that realizes a high luminance, a high efficiency, and a long lifetime.

In addition to the above configuration, the method according to the present invention is preferably such that the blocking regions are formed as organic thin layers coated by vapor deposition polymerization.

The blocking regions can be formed by a relatively simple method called vapor deposition polymerization.

In addition to the above configuration, the method according to the present invention is preferably such that the organic thin layers are formed by polymerization caused by vapor deposition of an organic material onto the substrate in a vacuum and heat treatment, and the vapor deposition is carried out simultaneously with or followed by the heat treatment.

By heat treatment, the substrate is heated, accelerating the reaction. This brings the following merits of:

(1) being able to complete vapor deposition polymerization;

(2) being able to control the degree of polymerization; and (3) being able to control orientation of molecules in the deposited layer.

In addition to the above configuration, the method according to the present invention is preferably such that the organic thin layers are formed by polymerization caused by vapor deposition of an organic material onto the substrate in a vacuum and exposure to electron beam or ultraviolet light, and the vapor deposition is carried out simultaneously with or followed by the exposure.

By exposure to electron beam or ultraviolet light, the substrate is heated, uniformizing temperatures of the substrate surface.

This brings the following merits of:

(1) being able to complete vapor deposition polymerization; and (2) being able to control the degree of polymerization.

In addition to the above configuration, the method according to the present invention is preferably such that the exposure to electron beam or ultraviolet light is followed by heat treatment.

By exposure to electron beam or ultraviolet light followed by heat treatment, the substrate is heated, uniformizing temperatures of the substrate surface.

This brings the following merits of:

(1) being able to complete vapor deposition polymerization; and (2) being able to control the degree of polymerization.

In addition to the above configuration, the method according to the present invention is preferably such that before the exposure to electron beam or ultraviolet light, a pattern is formed by transfer from a mask and removal of an uncured part.

This makes it possible to form pixels in producing an organic EL display panel and others.

INDUSTRIAL APPLICABILITY

The present invention is applicable to various kinds of devices prepared with an organic EL element, such as a display device for a television set, for example.

REFERENCE SIGNS LIST

1 Organic EL element
2 TFT

3 Cathode
4 Anode
6 Electron injection transport region
10 Anode
20 Cathode
30 Positive and negative charge transport layer
31 Hole injection transport region (charge generation region)
32 Electron blocking region
33 Light-emitting region
34 Hole blocking region
35 Electron injection transport region (charge generation region)
40 Substrate
50 Organic EL display device
52 TFT (thin-film transistor)
53 Interlayer insulating film
55 Edge cover

The invention claimed is:

1. A method for manufacturing an organic electroluminescent element including a homojunction-type positive and negative charge transport layer having a hole transporting capability and an electron transporting capability interposed between an anode and a cathode, the method comprising:
   (a) a step of forming the positive and negative charge transport layer, comprising the sub-steps of:
   (i) forming a light-emitting region comprising an organic light-emitting material by doping a host material with a light-emitting dopant; (ii) forming at least one of the following blocking regions: an electron blocking region, provided closer to the anode than the light-emitting region, having a lowest unoccupied molecular orbital (LUMO), an absolute value of the LUMO being smaller than that of a lowest unoccupied molecular orbital of the light-emitting region, wherein a difference in the lowest unoccupied molecular orbital between the electron blocking region and the light-emitting region is not less than 1 eV; and a hole blocking region, provided closer to the cathode than the light-emitting region, having a highest occupied molecular orbital (HOMO), an absolute value of the HOMO being larger than that of a highest occupied molecular orbital of the light-emitting region; and
   (iii) forming a hole injection transport region on the anode and an electron injection transport region on the hole blocking region, respectively,
   wherein in a direction from the anode to the cathode, the hole injection transport region, the electron blocking region, the light-emitting region, the hole blocking region, and the electron injection transport region are sequentially arranged, and
   wherein the step (a) forms the positive and negative charge transport layer to be a thin layer by reaction of at least one of organic material components for the positive and negative charge transport layer on a surface of the substrate or in a vapor phase,
   wherein a concentration gradient of the organic light-emitting material continuously increases from respective end faces of the light-emitting region on an electron blocking region side and on a hole blocking region side toward a center of the light-emitting region so that optical and electrical losses caused by a difference in refractive index and mobility between materials of separated layers can be reduced.

2. The method according to claim 1, wherein the blocking regions are formed as organic thin layers coated by vapor deposition polymerization.

3. The method according to claim 2, wherein the organic thin layers are formed by polymerization caused by vapor deposition of an organic material onto the substrate in a vacuum and heat treatment, and the vapor deposition is carried out simultaneously with or followed by the heat treatment.

4. The method according to claim 2, wherein the organic thin layers are formed by polymerization caused by vapor deposition of an organic material onto the substrate in a vacuum and exposure to electron beam or ultraviolet light, and the vapor deposition is carried out simultaneously with or followed by the exposure.

5. The method according to claim 4, wherein the exposure to electron beam or ultraviolet light is followed by heat treatment.

6. The method according to claim 4, wherein before the exposure to electron beam or ultraviolet light, a pattern is formed by transfer from a mask and removal of an uncured part.

7. A method for manufacturing an organic electroluminescent element including a homojunction-type positive and negative charge transport layer having a hole transporting capability and an electron transporting capability interposed between an anode and a cathode, the method comprising:
   (a) a step of forming the positive and negative charge transport layer, comprising the sub steps of:
   (i) forming a light-emitting region comprising an organic light-emitting material by doping a host material with a light-emitting dopant;
   (ii) forming a hole blocking region, provided closer to the cathode than light-emitting region, having a highest occupied molecular orbital (HOMO), an absolute value of the HOMO being larger than that of a highest occupied molecular orbital of the light-emitting region;
   (iii) forming an electron blocking region, provided closer to the anode than the light-emitting region, and having a lowest unoccupied molecular orbital (LUMO), an absolute value of the LUMO being smaller than that of a lowest unoccupied molecular orbital of the light-emitting region wherein a difference in the lowest unoccupied molecular orbital between the electron blocking region and the light-emitting region is not less than 1 eV;
   (iv) forming a hole injection transport region on the anode and an electron injection transport region on the hole blocking region, respectively,
   wherein in a direction from the anode to the cathode, the hole injection transport region, the electron blocking region, the light-emitting region, the hole blocking region, and the electron injection transport region are sequentially arranged, and
   wherein the step (a) forms the positive and negative charge transport layer to be a thin layer by reaction of at least one of organic material components for the positive and negative charge transport layer on a surface of the substrate or in a vapor phase,
   wherein a concentration gradient of the organic light-emitting material continuously increases from respective end faces of the light-emitting region on an electron blocking region side and on a hole blocking region side toward a center of the light-emitting region, and the concentration gradient of the organic light-emitting material is realized by using in-line-type equipment capable of gradient doping with a material deposition rate maintained constant.

8. The method according to claim 7, wherein the hole and electron blocking regions are formed as organic thin layers coated by vapor deposition polymerization.

9. The method according to claim 7, wherein the organic thin layers are formed by polymerization caused by vapor deposition of an organic material onto the substrate in a vacuum and heat treatment, and the vapor deposition is carried out simultaneously with or followed by the heat treatment.

10. The method according to claim 7, wherein optical or electrical losses caused by difference in refractive index or mobility between materials of separated layers can be reduced due to the concentration gradient of the organic light-emitting material.

11. The method according to claim 1, wherein the concentration gradient of the organic light-emitting material is realized by using in-line-type equipment capable of gradient doping with a material deposition rate maintained constant.

* * * * *